(12) United States Patent
Shimizu et al.

(10) Patent No.: US 10,326,304 B2
(45) Date of Patent: Jun. 18, 2019

(54) OPERATION STATE DETERMINATION SYSTEM AND PROGRAM

(71) Applicant: Panasonic Intellectual Property Management Co., Ltd., Osaka (JP)

(72) Inventors: Noriyoshi Shimizu, Osaka (JP); Takashi Nishiyama, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 412 days.

(21) Appl. No.: 15/100,005

(22) PCT Filed: Sep. 18, 2014

(86) PCT No.: PCT/JP2014/004799
§ 371 (c)(1),
(2) Date: May 27, 2016

(87) PCT Pub. No.: WO2015/087469
PCT Pub. Date: Jun. 18, 2015

(65) Prior Publication Data
US 2017/0018962 A1    Jan. 19, 2017

(30) Foreign Application Priority Data
Dec. 10, 2013    (JP) .................................. 2013-255394

(51) Int. Cl.
| | | |
|---|---|---|
| H02J 13/00 | (2006.01) | |
| G01R 21/133 | (2006.01) | |
| G06Q 50/06 | (2012.01) | |

(52) U.S. Cl.
CPC ........ *H02J 13/0006* (2013.01); *G01R 21/133* (2013.01); *G06Q 50/06* (2013.01)

(58) Field of Classification Search
None
See application file for complete search history.

(56) References Cited

U.S. PATENT DOCUMENTS

| | | |
|---|---|---|
| 2011/0138202 A1 | 6/2011 | Inoue et al. |
| 2011/0313693 A1 | 12/2011 | Inoue et al. |
| 2012/0084031 A1 | 4/2012 | Saito et al. |

FOREIGN PATENT DOCUMENTS

| | | |
|---|---|---|
| JP | 2001-264368 A | 9/2001 |
| JP | 2002-311070 A | 10/2002 |

(Continued)

OTHER PUBLICATIONS

Extended European Search Report issued in Application No. 14868888.0 dated Nov. 7, 2016.

(Continued)

*Primary Examiner* — Thienvu V Tran
*Assistant Examiner* — David M Stables
(74) *Attorney, Agent, or Firm* — McDermott Will & Emery LLP

(57) ABSTRACT

An operation state determination system includes a receiver, a first memory and a determiner. The determiner is configured to compare, at a prescribed determination time point, a power value stored in the first memory with a reference value to determine whether or not an electric load connected to a branch circuit is in operation, and output a signal in accordance with a determination result. The determiner is further configured to determine that the electric load is in operation at the prescribed determination time point, when a time period during which the power value is equal to or more than the reference value occurs within a comparison time in past before the prescribed determination time point.

10 Claims, 4 Drawing Sheets

(56) References Cited

FOREIGN PATENT DOCUMENTS

| JP | 2007-132804 A | | 5/2007 |
|---|---|---|---|
| JP | 2009-033287 A | | 2/2009 |
| JP | 2009-171823 A | | 7/2009 |
| JP | 2010-187487 A | | 8/2010 |
| JP | 2010187487 A | * | 8/2010 |
| JP | 2011-047604 A | | 3/2011 |
| JP | 2011-130535 A | | 6/2011 |
| JP | 2012-222976 A | | 11/2012 |
| WO | 2010/150480 A1 | | 12/2010 |
| WO | 2013/031886 A1 | | 3/2013 |
| WO | 2013/080619 A1 | | 6/2013 |

OTHER PUBLICATIONS

International Search Report and Written Opinion issued in Application No. PCT/JP2014/004799 dated Oct. 21, 2014, with English translation.

* cited by examiner

OPERATION STATE DETERMINATION SYSTEM AND PROGRAM

RELATED APPLICATIONS

This application is the U.S. National Phase under 35 U.S.C. § 371 of International Application No. PCT/JP2014/004799, filed on Sep. 18, 2014, which in turn claims the benefit of Japanese Application No. 2013-255394, filed on Dec. 10, 2013, the disclosures of which are incorporated by reference herein.

TECHNICAL FIELD

The invention relates generally to operation state determination systems and programs and, more particularly, to an operation state determination system configured to determine whether or not an electric load is in operation, and a program for causing a computer to function as the operation state determination system.

BACKGROUND ART

There has been proposed a conventional technique of measuring a consumed power value and comparing the consumed power value with a reference power value, in order to check presence or absence of electric power consumption while a user is out, etc., and inform the user of the result, thereby preventing electric power from being consumed during the user's absence (see e.g., Document 1: JP 2007-132804 A). The technique in Document 1 is to determine that the user has forgotten to turn off an electric load when the consumed power value measured is equal to or more than the reference power value.

But, an electric load, such as a clothes iron or an air-cleaning machine, automatically repeats on/off while it is operating. Accordingly, even during actually operating, when the power value is measured in an off period and compared with the reference power value, the electric load may be incorrectly determined to be in non-operation. That is, as the technique in Document 1, in case of the configuration of comparing the consumed power value measured while the user is out, etc., with the reference power value, there is a possibility that it is impossible to correctly detect that the electric load is operating.

DISCLOSURE OF THE INVENTION

It is an object of the present invention to provide an operation state determination system, which can determine whether or not an electric load is in operation, even when the electric load is a type of automatically repeating on/off while being in operation, and further provide a program for causing a computer to function as this operation state determination system.

An operation state determination system according to an aspect of the present invention includes: a receiver configured to acquire, from a meter, power values respectively consumed through two or more branch circuits branched in a distribution board installed in a facility of a power consumer; a first memory configured to store power information that includes a power value per branch circuit, acquired by the receiver, in association with date and time; and a determiner configured to compare, at a prescribed determination time point, the power value stored in the first memory with a reference value to determine whether or not an electric load connected to a branch circuit corresponding to the power value, of the two or more branch circuits, is in operation, and output a signal in accordance with a determination result. The determiner is configured to determine that the electric load is in operation at the prescribed determination time point, when a time period during which the power value is equal to or more than the reference value occurs within a comparison time in past before the prescribed determination time point.

In other words, this operation state determination system includes a receiver, a first memory and a determiner. The receiver is configured to acquire, from a meter, power values respectively consumed through N branch circuits (N is two or more integers) branched in a distribution board installed in a facility of a power consumer. The first memory is configured to store power information that includes a power value of each of the N branch circuits, acquired by the receiver, in association with date and time. The determiner is configured to compare, at a prescribed determination time point, the power value of each of the N branch circuits, stored in the first memory, with a reference value to determine whether or not an electric load connected to a branch circuit to be noted, of the two or more branch circuits, is in operation, and output a signal in accordance with a determination result. The determiner is further configured to determine that the electric load connected to the branch circuit to be noted is in operation at the prescribed determination time point, when a time period during which the power value of the branch circuit to be noted is equal to or more than the reference value occurs within a comparison time in past before the prescribed determination time point. In this case, the reference value is set as at least one value, and may be set to each of the N branch circuits individually, for example.

A program according to an aspect of the present invention is to cause a computer to function as the operation state determination system described above,

DESCRIPTION OF EMBODIMENTS

Figure 1:
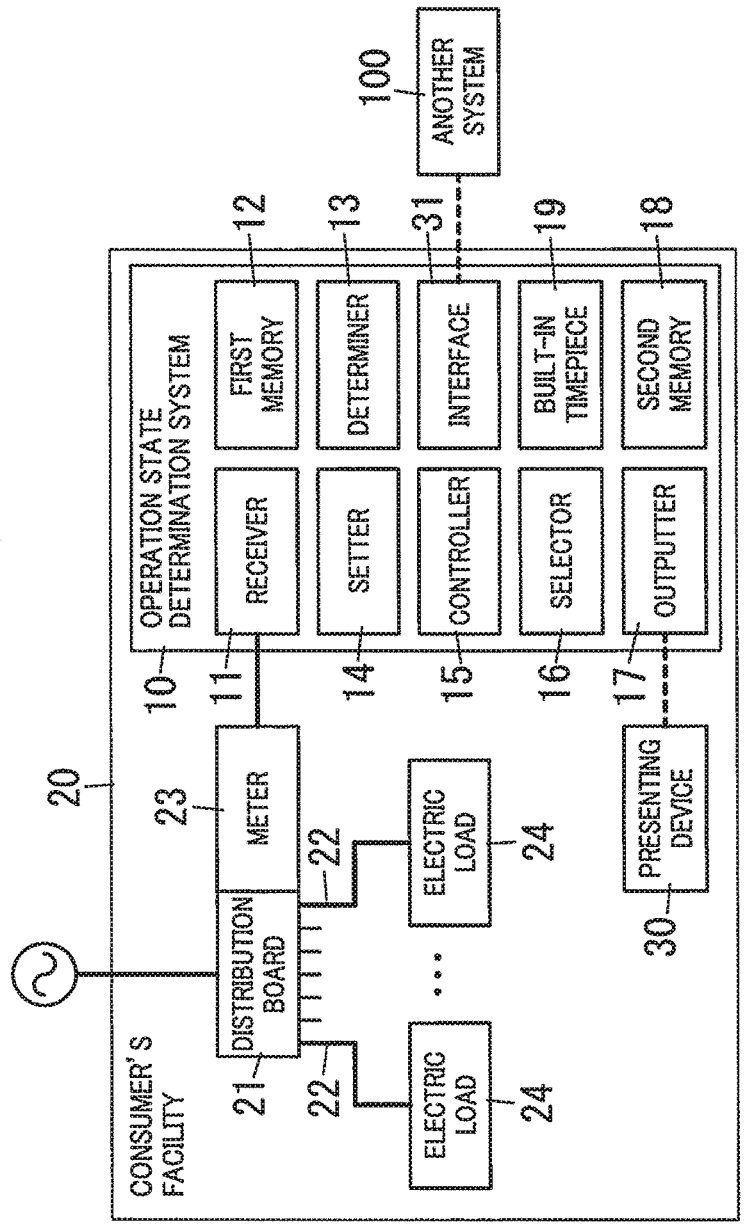
FIG. 1 is a block diagram illustrating an embodiment.
Figure 2:
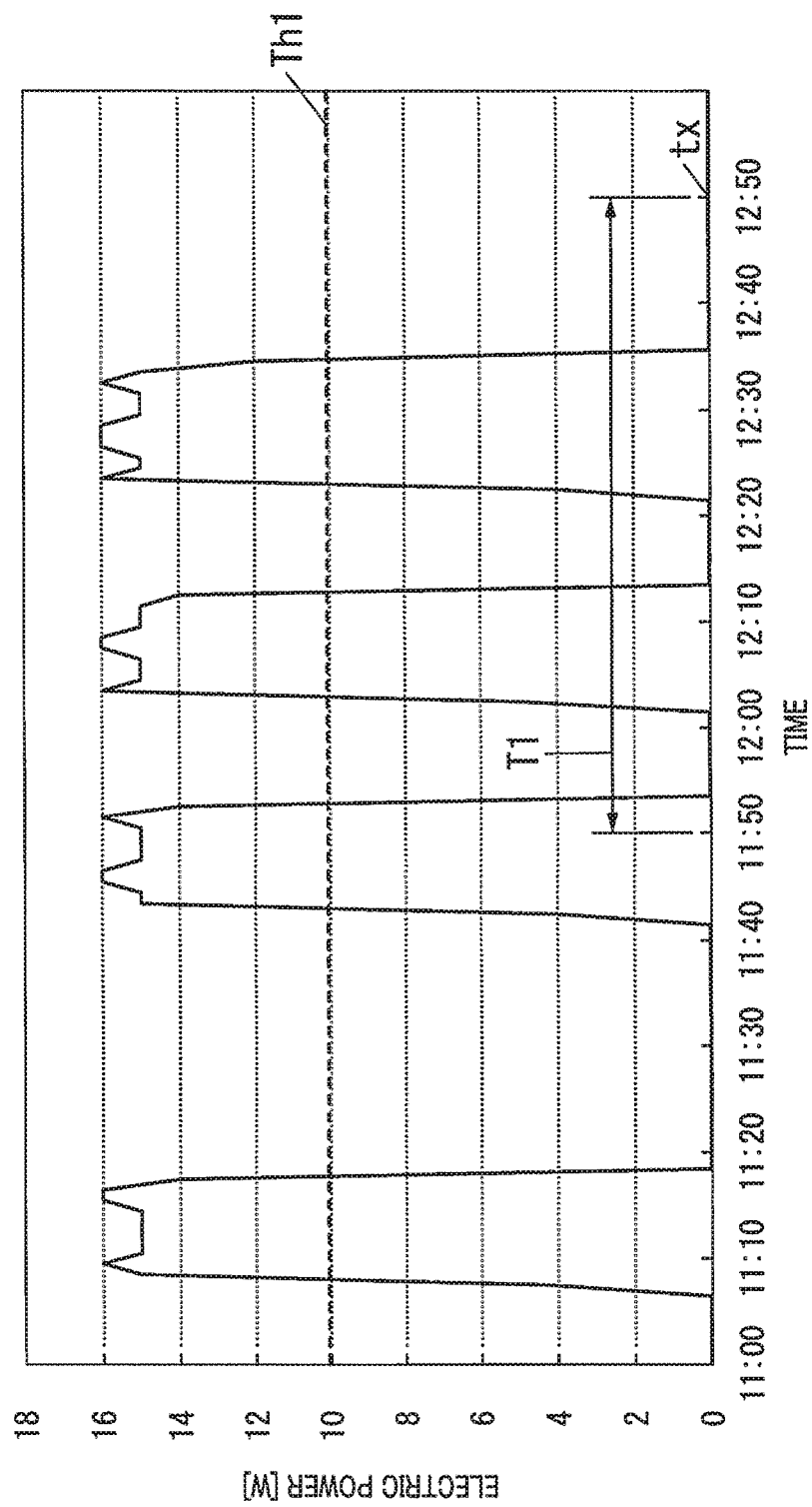
FIG. 2 is an explanatory diagram for an operational example of the embodiment.

As shown in FIG. 1, an operation state determination system 10 described below includes a receiver 11, a first memory 12 and a determiner 13. The receiver 11 is configured to acquire, from a meter 23, power values respectively consumed through two or more branch circuits 22 branched in a distribution board 21 installed in a facility 20 of a power consumer. The first memory 12 is configured to store power information that includes a power value per branch circuit 22, acquired by the receiver 11, in association with date and time. As shown in FIG. 2, the determiner 13 is configured to compare, at a prescribed determination time point tx, the power value stored in the first memory 12 with a reference value Th1 to determine whether or not an electric load 24 connected to a branch circuit 22 corresponding to the power value, of the two or more branch circuits 22, is in operation, and output a signal in accordance with a determination result. The determiner 13 is further configured to determine that the electric load 24 is in operation at the prescribed determination time point tx, when a time period during which the power value is equal to or more than the reference value Th1 occurs within a comparison time T1 in past before the prescribed determination time point tx.

Thus, the operation state determination system 10 has a configuration of determining that the electric load 24 is in operation at the prescribed determination time point tx, when a time period during which the power value is equal to or more than the reference value Th1 occurs within a comparison time T1 in past before the prescribed determination time point tx. According to this configuration, even when the electric load 24 is a type of automatically repeating on/off while being in operation, it is possible to determine whether or not the electric load 24 is in operation.

As shown in FIG. 1, the operation state determination system 10 is desirable to further include a setter 14 configured to variably set the reference value Th1 and the comparison time T1. The setter 14 is desirable to be configured to set the reference value Th1 and the comparison time T1 in units of the two or more branch circuits 22. The setter 14 is desirable to be configured to: calculate a standby power value per branch circuit 22 based on the power value stored in the first memory 12; and adjust the reference value Th1 with the standby power value as an offset value.

The operation state determination system 10 is desirable to further include an interface 31 configured to receive an operation content of another system 100. In this case, the determiner 13 is configured to: set timing when the interface 31 receives the operation content of the another system 100 to the prescribed determination time point tx; and determine, at the timing, whether or not the electric load 24 is in operation.

The operation state determination system 10 is desirable to further include a controller 15 configured to change an operation state of the electric load 24 to a non-operation state by remote control. In this case, the operation state determination system 10 is desirable to further include a selector 16 configured to select a certain electric load to be prohibited from changing an operation state of the certain electric load to a non-operation state. The controller 15 is configured not to change, to the non-operation, the operation state of the certain electric load 24 to be prohibited from changing to the non-operation state, selected by the selector 16, of electric loads 24 that are determined to be in operation by the determiner 13.

The operation state determination system 10 is desirable to further include an outputter 17 configured to output the determination result obtained by the determiner 13 to a presenting device 30. The operation state determination system 10 is desirable to further include a second memory 18 configured to store the determination result obtained by the determiner 13.

The operation state determination system 10 includes, as a main hardware element, a computer that executes a program for realizing the functions described above. That is, this program is to cause a computer to function as the operation state determination system 10 described above. Examples of this type of computer include a personal computer and a portable terminal device such as a smartphone or a tablet terminal device. The computer may be formed to include a processor integrally with a memory, as a microcontroller.

The program may be previously written in a ROM (Read Only Memory), or provided via a telecommunication network such as the Internet, or provided with a computer-readable storage medium.

Hereinafter, the configuration of this embodiment will be described in more detail. As shown in FIG. 1, a facility 20 of a power consumer includes a distribution board 21 for receiving power from a commercial power supply of an electric utility. The distribution board 21 branches the received power into two or more branch circuits 22 that constitute two or more systems so as to distribute the power into two or more electric loads 24 to be used in the facility 20. A meter 23 measures a power value consumed per branch circuit 22. In other words, the meter 23 measures the respective power values consumed through the branch circuits 22. The meter 23 may be disposed in the distribution board 21, or around the distribution board 21.

The branch circuits 22 may correspond to the electric loads 24 in one-to-one or one-to-many. In other words, when electric loads 24 have relatively large power consumption, such as an air-conditioner, an IH (Induction Heating) cooking heater and a microwave oven, branch circuits 22 may correspond to the electric loads 24 in one-to-one. In a case of one-to-many, a branch circuit 22 is often assigned to a place (room) in the facility 20, as a unit.

The meter 23 monitors, with a Rogowski coil or a clamp type current sensor, a current flowing through each branch circuit 22, and calculates, as a power value, an integrated value obtained by integrating the product of the monitored current value and a line voltage value of the each branch circuit 22. In other words, actually, the power value measured by the meter 23 is not instantaneous power but an amount of electric power per prescribed unit time (e.g., it is selected in a range of about 30 seconds to 10 minutes, and more desirably it is set to 30 seconds or 1 minute). Generally the instantaneous power per branch circuit 22 is changed with the lapse of time even within unit time, but, in this embodiment, the amount of integrated power per unit time is used as a power value without considering the change of the instantaneous power within unit time. This power value is regarded to be equivalent to an average power value in unit time (instantaneous power).

The power consumer of the facility 20 generally means a client receiving electric power from an electric utility, and, the facility 20 mentioned here means a space occupied by the client. Examples of the facility 20 include a dwelling house, a dwelling unit of a condominium, and a store of a tenant in a building for rent. However, those are merely examples, and the facility 20 is not limited.

The operation state determination system 10 includes a receiver 11 that acquires the respective power values corresponding to the branch circuits 22, measured by the meter 23. The power values acquired by the receiver 11 from the meter 23 each is associated with date and time, and then stored as power information into a first memory 12. The date and time is clocked by a built-in timepiece 19, such as a real-time clock, built in the operation state determination system 10. That is, the power information includes: a power value per unit time; and the date and time when the power value is acquired.

The first memory 12 needs to have a capacity capable of storing the power information that is collected for a period of about 30 minutes, but it may have a capacity capable of storing the power information that is collected for a period, which is selected from 1 day, 1 week, 1 month, and 1 year, etc. The first memory 12 stores the power information for each of the branch circuits 22 branched by the distribution board 21. That is, the first memory 12 stores a history of a transition in a power value for each of the branch circuits 22.

As shown in FIG. 2, this embodiment uses a history of a transition in a power value of an electric load 24 to be noted, stored in the first memory 12, in order to determine at an appropriate determination time point tx (12:50 in the illustrated example) whether or not the electric load 24 is in operation based on the power value thereof. That is, in case an electric load 24 connected to a branch circuit 22 is a type of automatically repeating on/off while being in operation, it is hard to determine whether or not the electric load 24 is in operation based on only the power value at the determination time point tx, when the determination time point tx overlaps with a time period during which the electric load 24 is in an off state.

Examples of this type of electric load 24 include an air-cleaning machine, a clothes iron and the like, and those are known to be configured to automatically repeat on/off while being in operation, namely, while power is applied to the electric load, or configured to change power to be consumed. When this type of electric load 24 is connected to a branch circuit 22 and is in operation, the power value at the determination time point tx is a transitional value generated temporarily. Accordingly, even if the power value of the branch circuit 22 (connected with the electric load 24) is 0 [W] at the determination time point tx, it is hard to determine whether the electric load 24 is temporarily in the off state while being in operation, or in non-operation in a state where no power is applied to the electric load).

In the example of FIG. 2, it is assumed that the reference value Th1 is set to 10 [W] and, when the power value is equal to or more than the reference value Th1, the electric load 24 is determined to be in operation. In this case, the power value at the determination time point tx in the figure is 0 [W], and the electric load is determined to be in a non-operation state. In the illustrated example, even if the power value is compared at the determination time point tx with the reference value Th1, whether it is in operation or non-operation cannot be determined. In other words, there is a possibility that the power is turned off before the determination time point tx and the electric load 24 is accordingly in non-operation, however, there is also a possibility that the electric load 24 is in operation continuously. For example, in case a user tries to know whether the electric load 24 is in operation or non-operation at the determination time point tx, in order to prevent from forgetting to turn off the electric load 24, when the electric load is determined to be in non-operation despite it is actually in operation, it would not help to prevent from forgetting to turn off.

In order to resolve this, the determiner 13 is configured to determine whether or not the electric load 24 is in operation based on the power value within a comparison time T1 in past before the determination time point tx, going back to past from the determination time point tx. In other words, the determiner 13 extracts from the first memory 12 the power value within the past comparison time T1, using the determination time point tx as a reference, and determines whether or not a state where the power value is equal to or more than the reference value Th1 has occurred within the comparison time T1. As shown in FIG. 2, in case the state where the power value is equal to or more than the reference value Th1 has occurred within the comparison time T1, the determiner 13 deems that the electric load 24 is in operation also at the determination time point tx.

The determination time point tx is a time point as timing at which a user confirms presence or absence of forgetting to turn off the electric load 24, or a time point that is previously set in the operation state determination system 10, as the timing of confirming the presence or absence of forgetting to turn off the electric load 24, etc. This time point is externally designated. In short, the determiner 13 determines, at the designated determination time point tx, whether or not the electric load 24 to be noted is in operation based on the past power value stored in the first memory 12.

Figure 3:
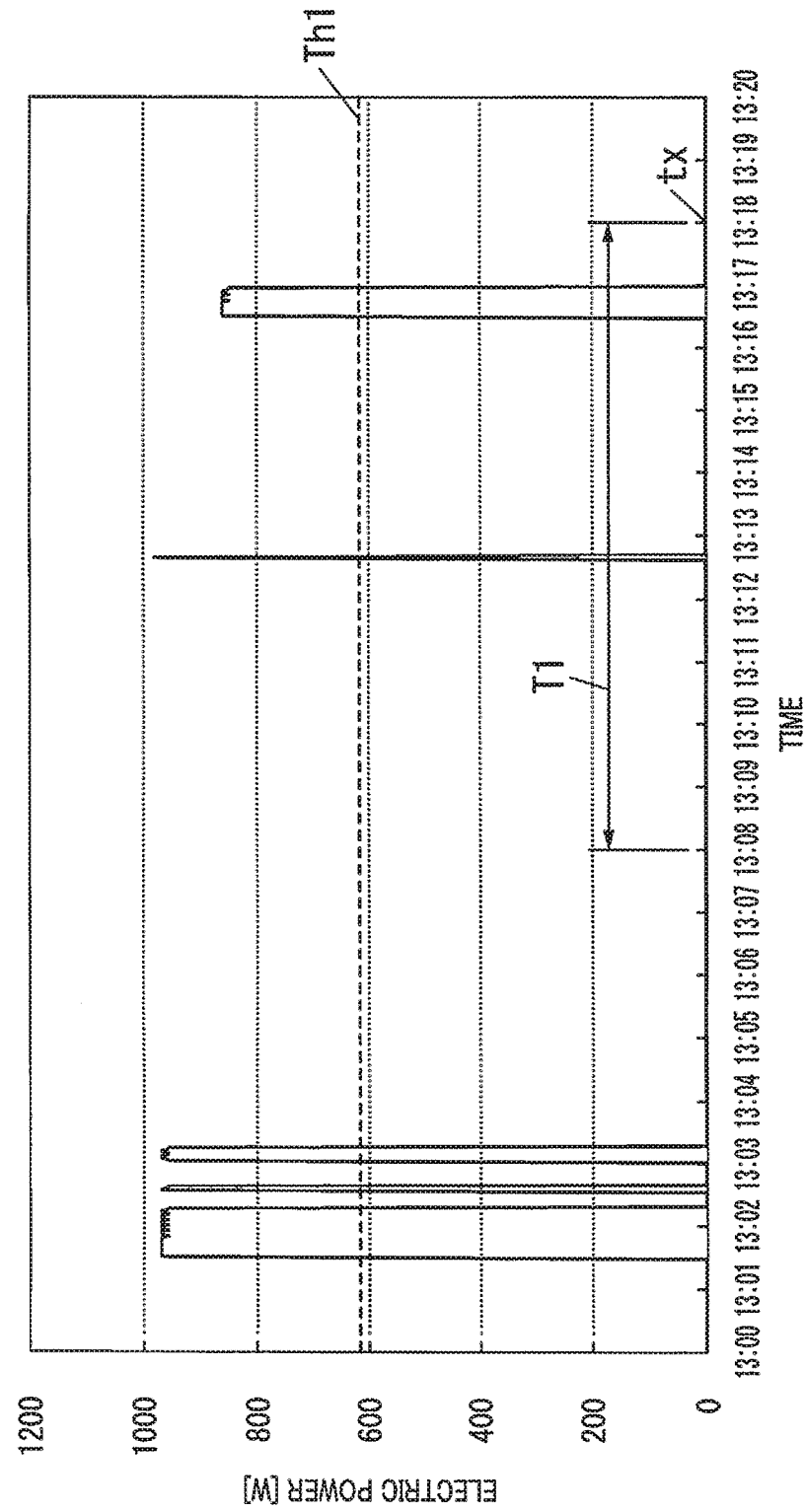
FIG. 3 is an explanatory diagram for an operational example of the embodiment.

FIG. 2 shows an example of a change in a power value in case the electric load 24 is an air-cleaning machine. In this case, the comparison time T1 is set to 60 minutes for example. FIG. 3 shows an example in case the electric load 24 is a clothes iron. In the example of FIG. 3, the reference value Th1 is set to 600 [W], and the comparison time T1 is set to 10 minutes, and the example of FIG. 3 is similar to that of FIG. 2 except for those. That is, the determiner 13 determines, at the designated determination time point tx (13:18 in the illustrated example), whether or not the electric load 24 is in operation based on the past power value stored in the first memory 12.

In any cases of FIGS. 2 and 3, the determiner 13 deems that the electric load 24 is in operation also at the determination time point tx. Of course, in the examples of FIGS. 2 and 3, a possibility that the electric load 24 is actually already in non-operation at the determination time point tx is not zero, but, it is possible to attract a user's attention by informing the user that the electric load 24 has been in an operation state until just before the time point.

The determiner 13 outputs a signal in accordance with the determination result obtained at the determination time point tx. The determination result may be applied according to the purpose of using the operation state determination system 10. For example, in case the user uses the operation state determination system 10 for confirming the presence or absence of forgetting to turn off the electric load 24, the information about whether or not the electric load 24 is in operation is presented to the user, based on the signal output by the determiner 13. The determination result output by the determiner 13 may be also memorized to be analyzed later. Those configurations will be described later.

Incidentally as seen from the examples of FIGS. 2 and 3, the reference value Th1 and the comparison time T1 vary depending on types of electric loads 24. The branch circuits may correspond to the electric loads 24 in one-to-one or one-to-many as described above, but, in any cases, the reference value Th1 and the comparison time T1 are desirable to be set in units of the branch circuits 22. For this reason, as shown in FIG. 1, the operation state determination system 10 includes a setter 14 configured to variably set the reference value Th1 and the comparison time T1 that are input to the determiner 13.

The setter 14 sets the reference value Th1 and the comparison time T1 combined with each other. Since the reference value Th1 and the comparison time T1 vary depending on types of electric loads 24 that are used in the consumer's facility 20, those are desirable to be interactively set in accordance with each facility 20 through an operation device and a display device.

The operation device and the display device may be provided as a dedicated operation display device formed only for the operation state determination system 10. The operation display device includes: a display device that is a flat panel display (such as a liquid crystal display); and an operation device (such as a touch panel or a push button switch), formed integrally with the display device. Alternatively, the operation state determination system 10 may have an interface (not shown) for communicating with a terminal device that serves as the operation device and the display device. Examples of this type of terminal device include a personal computer, a smartphone and a tablet terminal device.

Table 1 below shows an example of a case where reference values Th1 and comparison times T1 are set to the branch circuits 22. In the setting example of Table 1, the branch circuits 22 are associated with names of rooms. That is, the three branch circuits 22 are respectively associated with the names: "Living Room"; "Japanese-style Room"; and "Western-style Room".

TABLE 1

| Branch Circuit | Reference Value [W] | Comparison Time [min] |
| --- | --- | --- |
| Living Room | 600 | 10 |
| Japanese-style Room | 10 | 60 |
| Western-style Room | 200 | 40 |

In the example of Table 1, it is assumed that a clothes iron is used in a living room and an air-cleaning machine is used in a Japanese-style room, and accordingly, the reference value Th1 of the living room is set to 600 [W] and the reference value Th1 of the Japanese-style room is set to 10 [W]. Thus, since the reference value Th1 and the comparison time T1 are individually set to each of the branch circuits 22, depending on an electric load 24 to be used, it is possible to find the possibility of forgetting to turn off the electric load 24 in distinction from the other electric load(s) 24.

As described above, two or more electric loads 24 may be connected to a single branch circuit 22. Specifically, electric loads 24, such as a television receiver and a video recorder, may be connected to a branch circuit 22, to which an air-cleaning machine as an electric load 24 is connected. The electric loads 24 such as the television receiver and the video recorder consume standby power even while being in non-operation. In case an electric load 24 is an air-cleaning machine where the power consumption in a non-operation state (i.e., in a state where no power is applied to the electric load) is 0 [W], the reference value Th1 for determining whether or not the air-cleaning machine is in operation is set to 10 [W] for example (see Table 1). On the other hand, in case the standby power value of the branch circuit 22 (to which the air-cleaning machine is connected) is assumed to be 20 [W] as shown in FIG. 4, if the reference value Th1 is set to 10 [W], the air-cleaning machine would be incorrectly determined to be always in operation.

In order to resolve this, the setter 14 is desirable to be configured to set the reference value Th1 in consideration of the standby power value. That is, the setter 14 is desirable to be configured to calculate the standby power value per branch circuit 22 based on the power value stored in the first memory 12. The setter 14 is desirable to be configured to adjust the reference value Th1 with the obtained standby power value as an offset value.

Figure 4:
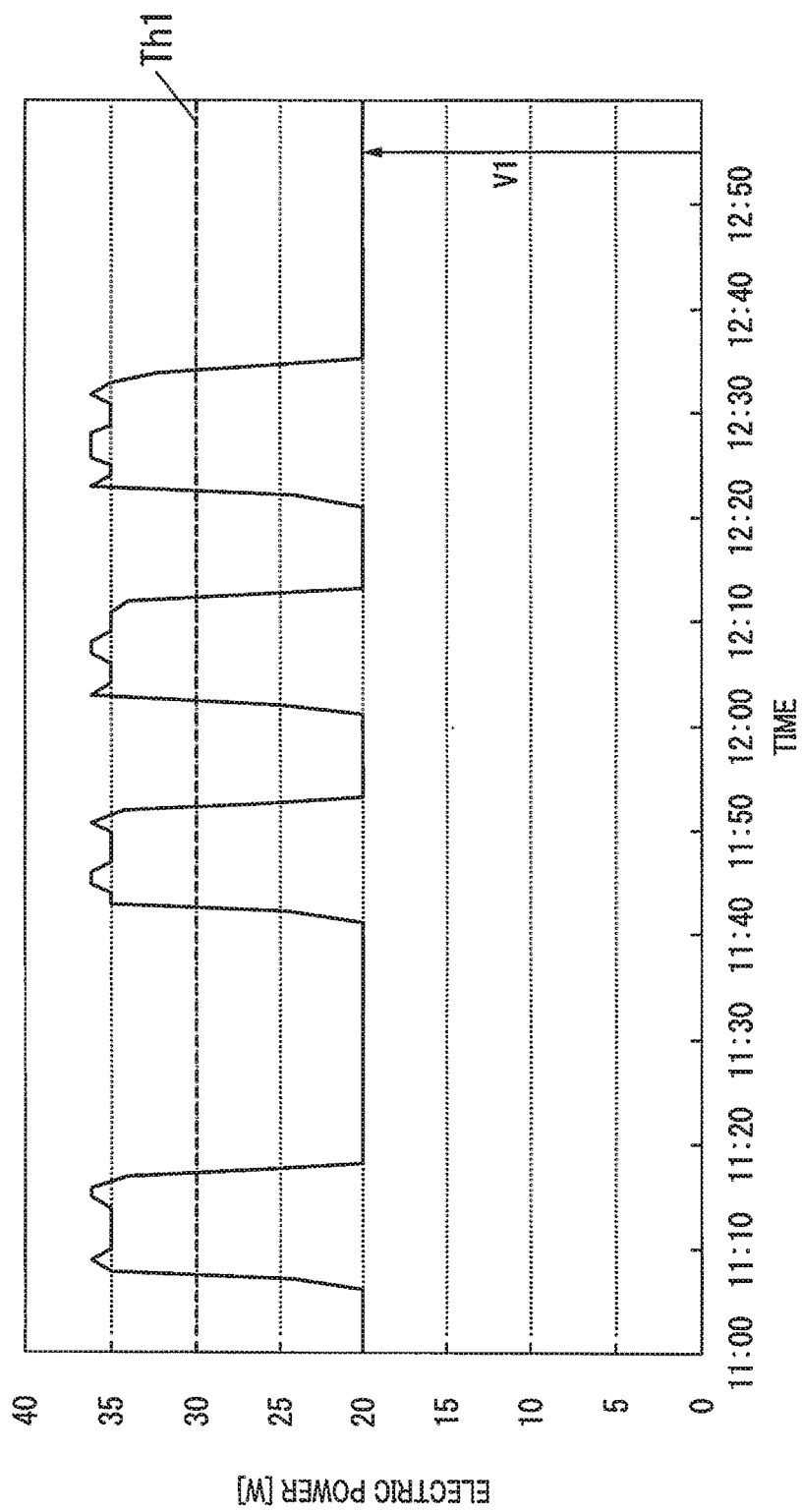
FIG. 4 is an explanatory diagram for an operational example of the embodiment.

The example of FIG. 4 shows that a standby power value V1 is 20 [W] and a difference of 10 [W] is needed for determining whether or not the air-cleaning machine is in operation. In this case, 10 [W] is given, to the setter 14, as the standard reference value Th1 with respect to the air-cleaning machine. The setter 14 sets 20 [W] as the standby power value V1 to the offset value, adds 20 [W] as the offset value to the given 10 [W], and sets the obtained 30 [W] to the reference value Th1. In short, the standby power value is deemed to be the normal power value, and the reference value Th1 is a value (30 [W]) obtained by adding the normal power value (20 [W]) to 10 [W] as a threshold value capable of determining whether or not the air-cleaning machine is in operation.

In the above-mentioned configuration, since the setter 14 automatically obtains the standby power value V1, a user does not need to be conscious of the standby power value V1. In addition, the reference value Th1 for determining whether or not an electric load 24 as an object is in operation can be automatically set in accordance with the standby power.

The standby power value V1 of each of the branch circuits 22 is obtained based on a change of a power value in a prescribed period such as 1 day. Such a change of the power value is obtained from the history of the power value, stored in the first memory 12. Specifically, a comparison value may be compared with the power value while being changed to gradually reduce, and the minimum value of the comparison value may be used as the standby power value, when meeting a condition that a duration time, during which the power value is less than the comparison value, is equal to or more than a prescribed reference time. The reference time to be compared with the duration time is determined in accordance with the use frequency and the use time slot of each electric load 24. In other words, the reference time is set in accordance with a time during which an electric load 24 as an object is in a non-operation state.

Incidentally, it is considered that timing when a user confirms presence or absence of forgetting to turn off an electric, load(s) 24 is when he/she goes out or to bed, etc. In case a security system is installed in the consumer's facility 20, it is also considered that the user operates the security system so as to be activated at timing when he/she goes out or to bed. It is also considered that the user operates an electronic lock of a vestibule door when he/she goes out, or turns off a lighting system in a bedroom when he/she goes to bed.

In case it is considered that timing of confirming the operation state of the electric load 24 is the approximately same as timing of operating another system, when the operation state determination system 10 is configured to check the operation state of the electric load 24, cooperating with the user's operation to this type of system, it is possible to save the user's effort for operating the operation state determination system. In other words, the operation state determination system 10 is desirable to include an interface (hereinafter, referred to as I/F) 31 configured to receive an operation content of another system 100. In case another system 100 is operated by the user when he/she goes out or to bed, the I/F 31 is configured to receive a signal generated in accordance with his/her operation to another system 100, and inform the determiner 13 of the reception.

Accordingly, when another system 100 is operated by the user upon going out or going to bed, etc., the operation is reported to the determiner 13 via the I/F 31. The determiner 13 sets the timing of receiving the report to the determination time point tx, and then performs the above processing. That is, the determiner 13 determines presence or absence of an electric load(s) 24 being in operation at the determination time point tx. According to this configuration, it is not necessary for the user to operate the operation state determination system 10, and when another system 100 is operated, the presence or absence of an electric load(s) 24 being in operation can be automatically checked.

The operation state determination system 10 is desirable to further include a controller 15 configured to control an operation state/an non-operation state of an electric load(s) 24. The controller 15 is desirable to be configured to remotely control the electric load(s) 24. In this case, the controller 15 is desirable to communicate with the electric load(s) 24, by a radio communication technology using radio waves as a transmission medium, or a power line communication technology using a power line as a signal transmission line. This type of function may adopt a technology used in a controller of HEMS (Home Energy Management System).

The function of the operation state determination system 10 in this embodiment may be installed in the controller of HEMS. Alternatively, part of the function of the operation state determination system 10 may be realized by a server (it may a cloud server), and the function of the server may be utilized through a terminal device.

The controller 15 can realize the remote control of the operation state/the non-operation state of the electric load(s) 24. Therefore, when the determiner 13 determines that an electric load 24 has been forgotten to be turned off, a user can change the operation state of the electric load 24 to the non-operation state on the spot, without going to a place where the electric load 24 is disposed.

However, electric loads 24 may also include a type of electric load 24 that is inconvenient to change to a non-operation state before a series of processing is finished when operated once. Examples of this type of electric load 24 include a video recorder, a washing machine, a dishwasher and the like. Accordingly, in case the system includes the controller 15 that changes an operation state of an electric load(s) 24 to a non-operation state by remote control, the system needs to be configured not to incorrectly change this type of electric load 24 to a non-operation state. For this reason, the operation state determination system 10 is desirable to include a selector 16 configured to select an electric load 24 that is allowed to be changed to a non-operation state by the controller 15, or an electric load 24 that is prohibited from being changed to a non-operation state by the controller 15. That is, even when an electric load 24 to be noted is determined to be in operation by the determiner 13, the controller 15 does not change the electric load 24 to be noted to a non-operation state, if the electric load 24 to be noted is prohibited to be changed to the non-operation state by the selector 16.

Incidentally, in case of presenting the determination result obtained by the determiner 13, the operation state determination system 10 further includes an outputter 17 that outputs the determination result to a presenting device 30. The presenting device 30 for presenting the determination result may be provided as the above-mentioned display device. According to this configuration, a user can easily confirm whether or not an electric load 24 connected to a certain branch circuit 22 of the branch circuits 22 is in operation at the determination time point tx, through the content presented by the presenting device 30.

Note that, each branch circuit 22 is desirable to be associated with a name of an electric load 24 or a place (room) such that the user can easily specify a branch circuit 22 as an object from the content presented by the presenting device 30. In this case, for example as shown in Table 2 below, names of places (rooms) corresponding to branch circuits 22 are displayed on a screen of the presenting device 30, when electric loads 24 connected to the branch circuits have been forgotten to be turned off.

TABLE 2

Branch Circuit where Electric Load
has been forgotten to be turned off

Living Room
Japanese-style Room

In case of accumulating the determination result obtained by the determiner 13, the operation state determination system 10 is desirable to further include a second memory 18 configured to store the determination result obtained by the determiner 13. The second memory 18 is configured to store a history of the determination result, and it is possible to confirm the history of the determination result afterward through the above-mentioned operation display device or terminal device. The information to be stored in the second memory 18 include a set of a determination condition, a determination result and a basis for determination, corresponding to each branch circuit 22, as shown in Table 3 below for example.

TABLE 3

| Branch Circuit | Determination Condition | Determination Result | Basis for Determination |
| --- | --- | --- | --- |
| Living Room | Has Power Value exceeded 600 [W] within 10 mins? | Yes | 800 [W] has been consumed within 2 mins. |
| Japanese-style Room | Has Power Value exceeded 10 [W] within 60 mins? | Yes | 16 [W] has been consumed within 15 mins. |
| Western-style Room | Has Power Value exceeded 200 [W] within 40 mins? | No | |

The second memory 18 may be a memory card capable of being detachably attached to the operation state determination system 10. In this case, the history of the determination result stored in the second memory 18 can be read and analyzed by another computer.

Note that, the embodiment described above is one example according to the present invention. Accordingly, the present invention is not limited to the embodiment, but numerous modifications and variations can be made in accordance with the design and the like without departing from the technical ideas according to the present invention, even other than the embodiment.

The invention claimed is:

1. An operation state determination system, comprising:
a receiver configured to acquire, from a meter, power values respectively consumed through two or more branch circuits branched in a distribution board installed in a facility of a power consumer;
a first memory configured to store power information that includes a power value per branch circuit, acquired by the receiver, in association with date and time; and
a determiner configured to compare, at a prescribed determination time point, the power value stored in the first memory with a reference value to determine whether or not an electric load connected to a branch circuit corresponding to the power value, of the two or more branch circuits, is in operation, and output a signal in accordance with a determination result,
the determiner being configured to determine that the electric load is in operation at the prescribed determination time point, when a time period during which the power value is equal to or more than the reference value occurs at least once within a comparison time in past before the prescribed determination time point.

2. The operation state determination system according to claim 1, further comprising a setter configured to variably set the reference value and the comparison time.

3. The operation state determination system according to claim 2, Wherein the setter is configured to set the reference value and the comparison time in units of the two or more branch circuits.

4. The operation state determination system according to claim 3, wherein the setter is configured to:
   calculate a standby power value per branch circuit based on the power value stored in the first memory; and
   adjust the reference value with the standby power value as an offset value.

5. The operation state determination system according to claim 1, further comprising an interface configured to receive an operation content of another system,
   wherein the determiner is configured to:
      set timing when the interface receives the operation content of the another system to the prescribed determination time point; and
      determine, at the timing, whether or not the electric load is in operation.

6. The operation state determination system according to claim 1, further comprising a controller configured to change an operation state of the electric load to a non-operation state by remote control.

7. The operation state determination system according to claim 6, further comprising a selector configured to select a certain electric load to be prohibited from changing an operation state of the certain electric load to a non-operation state,
   wherein the controller is configured not to change, to the non-operation, the operation state of the certain electric load to be prohibited from changing to the non-operation state, selected by the selector, of electric loads that are determined to be in operation by the determiner.

8. The operation state determination system according to claim 1, further comprising an outputter configured to output the determination result obtained by the determiner to a presenting device.

9. The operation state determination system according to claim 1, further comprising a second memory configured to store the determination result obtained by the determiner.

10. A computer-readable recording medium recording a program for causing a computer to function as the operation state determination system according to claim 1.

* * * * *